(12) United States Patent
Su et al.

(10) Patent No.: US 7,626,332 B2
(45) Date of Patent: Dec. 1, 2009

(54) LUMINANCE UNIFORMITY ENHANCEMENT METHODS FOR AN OLED LIGHT SOURCE

(75) Inventors: Wencheng Su, Cupertino, CA (US); Homer Antoniadis, Mountain view, CA (US); Franky So, San Jose, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 225 days.

(21) Appl. No.: 11/205,530

(22) Filed: Aug. 16, 2005

(65) Prior Publication Data
US 2007/0040494 A1    Feb. 22, 2007

(51) Int. Cl.
*H01J 1/62* (2006.01)
*H01J 63/04* (2006.01)

(52) U.S. Cl. .................. 313/506; 313/498; 313/503; 313/504; 313/505; 313/483; 313/500

(58) Field of Classification Search .................. 313/506, 313/504
See application file for complete search history.

(56) References Cited

U.S. PATENT DOCUMENTS

| 5,128,587 | A  | * | 7/1992  | Skotheim et al. ............. 313/504 |
| 6,486,601 | B1 | * | 11/2002 | Sakai et al. .................. 313/504 |
| 6,658,037 | B2 | * | 12/2003 | Kahen et al. ................... 372/70 |
| 6,803,129 | B2 | * | 10/2004 | Lin et al. ...................... 428/690 |
| 2002/0027623 | A1 | * | 3/2002 | Doi et al. ......................... 349/69 |
| 2002/0097194 | A1 | * | 7/2002 | Uchida et al. ................. 345/3.1 |
| 2002/0125819 | A1 | * | 9/2002 | Mishima ...................... 313/504 |
| 2004/0086746 | A1 | * | 5/2004 | Lin et al. ...................... 428/690 |
| 2005/0116620 | A1 | * | 6/2005 | Kobayashi .................... 313/503 |
| 2005/0191927 | A1 | * | 9/2005 | Gambogi et al. .............. 445/24 |
| 2006/0083945 | A1 | * | 4/2006 | Morishita et al. ........... 428/690 |
| 2006/0163589 | A1 | * | 7/2006 | Fan et al. ....................... 257/88 |

* cited by examiner

*Primary Examiner*—Mariceli Santiago
*Assistant Examiner*—Natalie K Walford
(74) *Attorney, Agent, or Firm*—Fish & Richardson P.C.

(57) ABSTRACT

An electroluminescent device utilizes a plurality of embodiments to minimize the variation in luminance due to changes in the voltage across the device. These include a highly conductive hole injection layer in a bi-layer device, a thick hoe transporting interlayer in a tri-layer device and the addition of an external resistor in series with the device.

15 Claims, 5 Drawing Sheets

LUMINANCE UNIFORMITY ENHANCEMENT METHODS FOR AN OLED LIGHT SOURCE

BACKGROUND

1. Field of the Invention

In general, the invention involves organic light emitting diode (OLED) devices. More specifically, the invention involves luminance uniformity enhancement methods and apparatus for a OLED lighting device used in medical device and similar applications.

2. Related Art

An OLED (Organic Light Emitting Diode) device could be fabricated from either small molecule or polymeric materials. A typical device structure of a polymer light-emitting diode (PLED) consists of an anode (e.g. indium-tin-oxide (ITO)), a hole injection layer (e.g. PEDOT:PSS or polyaniline), an electroluminescent (also light emitting polymer or LEP) layer, and a cathode layer (e.g. barium covered with aluminum). Among the two organic layers, the function of the hole injection layer is to provide efficient hole injection into subsequent layers. In addition, hole injection layer also acts as a buffer layer to smooth the surface of the anode and to provide a better adhesion for the subsequent layer. The function of the electroluminescent layer is to transport both types of carriers and to efficiently emit light of desirable wavelength from electron-hole pair (exciton) recombination. The desired emission wavelength can be conveniently controlled by proper selection of the light-emitting polymers. A well-defined hole transport interlayer between the HIL and LEP can also be used to enhance device efficiency and improve device operational stability. A typical device structure of small molecule-based light-emitting devices consists of an anode, a hole injection layer, a hole transport layer, an electroluminescent layer, an electron transport layer, and a cathode. Among them, the electron transport layer is used to enhance electron transport from the cathode to the emissive layer. The functions of other layers are similar to those in a PLED device.

For some applications such as medical devices, OLED lighting devices usually have to demonstrate sufficiently high luminance uniformity across the whole emitting area. Luminance non-uniformity of less than 10% is often required for a very large emitting area (e.g. 3 cm$^2$). Given these requirements, conventional OLED devices must be specifically re-designed to be successfully used as a light source for medical devices and similar applications.

For instance, compared to the metallic cathode, an ITO anode has much higher resistivity (usually 10-20 Ohm/cm). For relatively large emissive area (e.g., 3 cm$^2$), the voltage drop along the ITO could become significant and result in unacceptable luminance uniformity. A conventional way to reduce the voltage drop is to deposit some high conductivity metal lines on the top of ITO. Although this could solve the voltage drop problem, it usually requires more metal deposition, patterning, and corresponding photolithography processes, causing longer processing time and higher production cost. In addition, because the metal lines are usually opaque, it can also reduce effective emitting area and efficiency.

DETAILED DESCRIPTION

Figure 1:
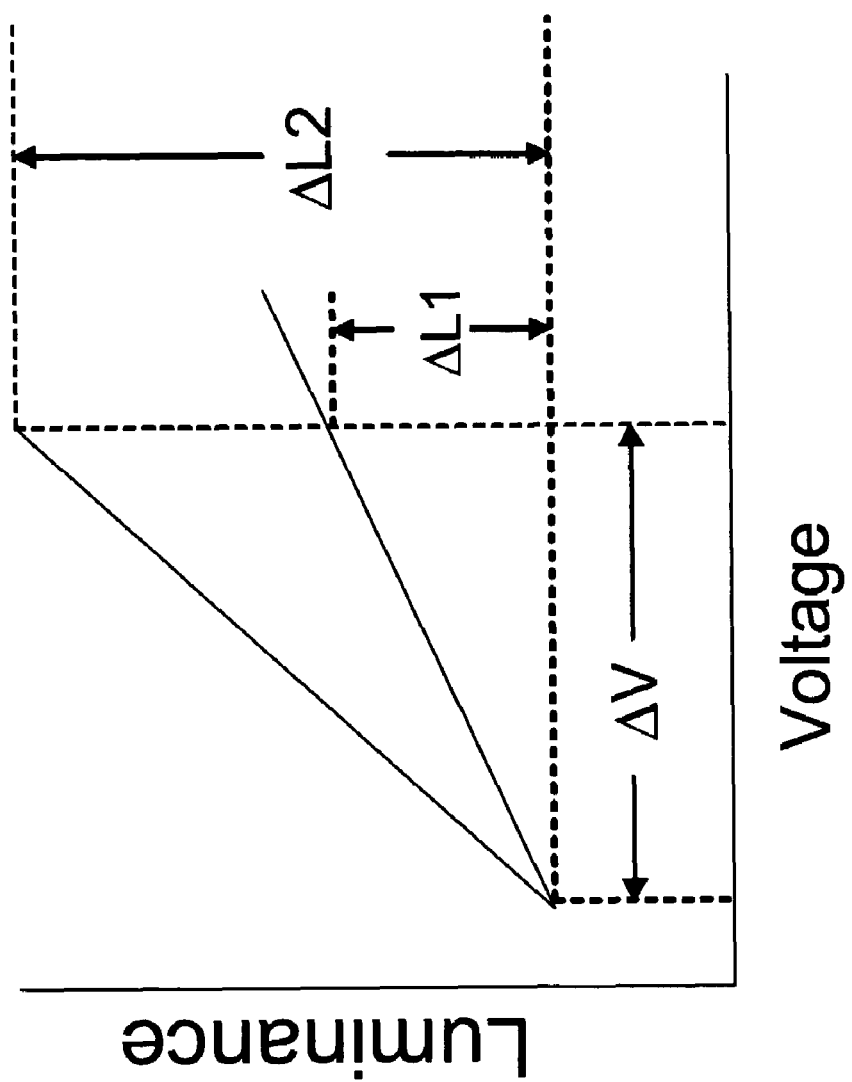
FIG. 1 illustrates the relationship between changes in voltage and luminance for OLED devices.

One or more embodiments of the invention enhance the luminance uniformity of OLED lighting devices by manipulating the device luminance-voltage characteristics. FIG. 1 illustrates the relationship between changes in voltage (V) and luminance (L) for OLED devices. $\Delta V$ is the voltage change across the device, while $\Delta L1$ and $\Delta L2$ are the corresponding luminance changes for a smaller and a larger dL/dV, respectively. The luminance uniformity of OLED lighting devices is directly related to the magnitude of luminance change (L) with voltage (V) around the operating voltage, that is, dL/dV around the operating voltage. If dL/dV is smaller, the luminance variation will be smaller for the same voltage drop, thus improving the luminance uniformity across the whole lighting area.

In the various embodiments of the invention, the change or variation in luminance of an electroluminescent device due to changes in voltage across the device is minimized. This enhances the luminance uniformity of the device making it more suitable to lighting applications. In one embodiment of the invention, an additional external resistor is provided in series with an organic light emitting diode. The additional external resistor has a resistance that is greater than the dynamic resistance of the organic light emitting diode device. In another embodiment of the invention, a tri-organic layer electroluminescent device is disclosed which has a thicker hole transporting interlayer along with a hole injection layer and electroluminescent layer.

Other embodiments of the invention enhance the luminance uniformity by minimizing the voltage drop across the device using an additional and effective conductive path besides the anode (usually ITO (indium tin oxide)). In at least one embodiment of the invention, a two or more organic layer OLED device is disclosed which uses a highly conductive hole injection layer in conjunction with an emissive layer. The highly conductive hole injection layer provides an alternate current path to minimize the changes in voltage across the device disposed below, and hence increases luminance uniformity.

Figure 2:
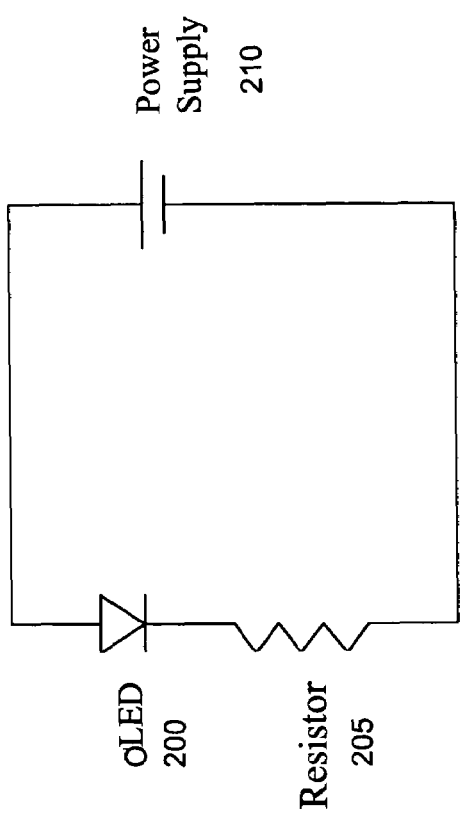
FIG. 2 illustrates a schematic of at least one embodiment of the invention.

FIG. 2 illustrates a schematic of at least one embodiment of the invention. One means of reducing the dL/dV from that of a typical device is to increase the series resistance of the device. This way, the device I-V characteristics become more linear (and with smaller dL/dV) and the resulting devices will have better luminance uniformity. The additional series resistance for the device should be fed to the power supply side in order to avoid overheating of the glass substrate. FIG. 2 shows an equivalent circuit in accordance with the invention consisting of a OLED device 200, the additional external resistor 205, and power supply 210, all together in series. Additional external resistor 205 is additional to any inherent resistance due to device 200, lead-ins, contacts, wiring etc. and is specifically and intentionally added in series as an extra resistance. Assume that $V_S$, $V_{OLED}$, and $V_R$ represents the voltage output of the power supply 210, the voltage drop across the OLED device 200, and the voltage drop across the additional external resistor 205, respectively. Their relationship is as follows:

$$V_S = V_{OLED} + V_R = V_{OLED} + I*R,$$

where I is the current to the OLED device, and R is the resistance of the additional external resistor 205. In order for the additional external resistor to have significant effect on the dL/dV, following relationship has to be satisfied:

$$R > V_{OLED}/I.$$

Thus, the resistance R of the additional external resistor 205 should be higher than the dynamic resistance (based on the supplied current) of the OLED device ($V_{OLED}/I$). Preferably, the resistance R of the additional external resistor has a resistance value in the range of 1 to 10 times of the dynamic resistance of the OLED device.

Figure 3:
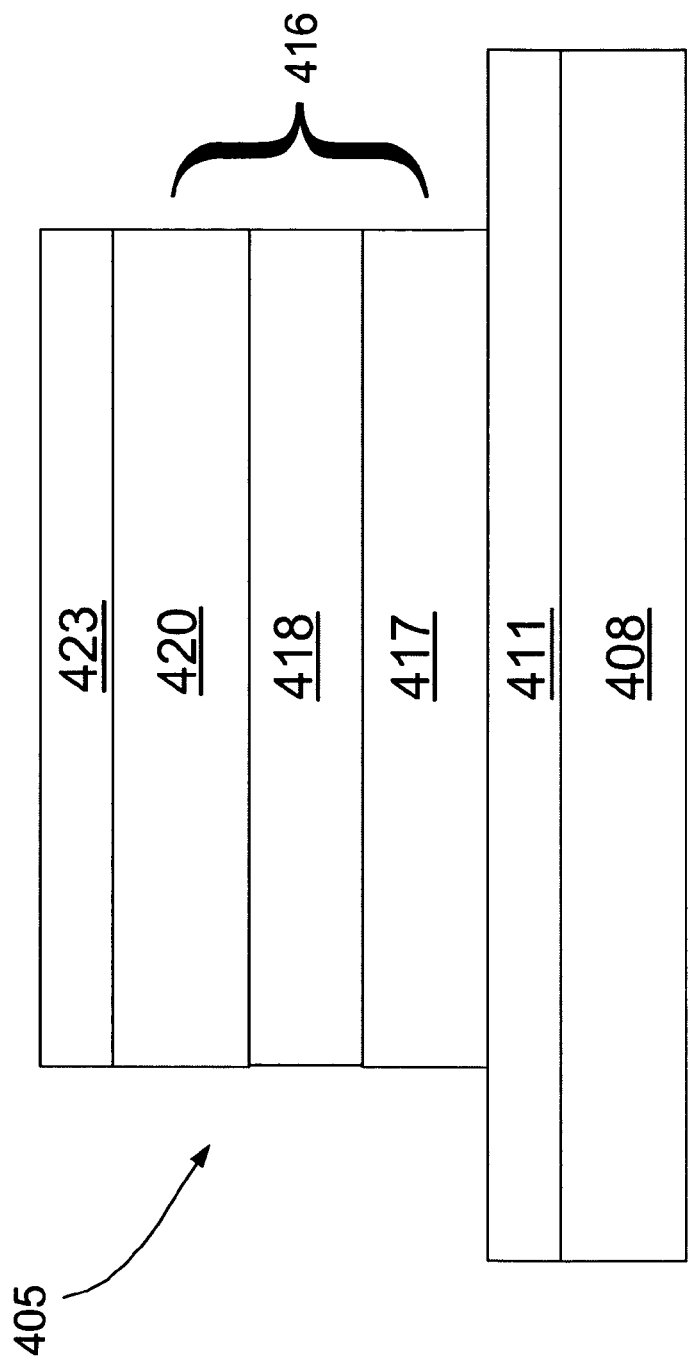
FIG. 3 shows a cross-sectional view of an EL device 405 according to at least one embodiment of the invention.

FIG. 3 shows a cross-sectional view of an embodiment of an EL device 405 according to at least one embodiment of the invention. The EL device 405 may represent one pixel or sub-pixel of a larger lighting source. As shown in FIG. 3, the EL device 405 includes a first electrode 411 on a substrate 408. As used within the specification and the claims, the term "on" includes when layers are in physical contact or when layers are separated by one or more intervening layers.

One or more organic materials are deposited to form one or more organic layers of an organic stack 416. The organic stack 416 is on the first electrode 411. In at least one embodiment of the invention, the organic stack 416 includes a hole injection layer ("HIL") 417 and emissive layer (EML) 420 and a hole transporting (HT) interlayer 418 disposed between the HIL 417 and the EML layer 420. If the first electrode 411 is an anode, then the HIL 417 is on the first electrode 411. Alternatively, if the first electrode 411 is a cathode, then the EML 420 is on the first electrode 411, and the HIL 417 is on the EML 420. The OLED device 405 also includes a second electrode 423 on the organic stack 416. Other layers than that shown in FIG. 3 may also be added including barrier, charge transport/injection, and interface layers between or among any of the existing layers as desired. Some of these layers, in accordance with the invention, are described in greater detail below.

Substrate 408:

The substrate 408 can be any material that can support the organic and metallic layers on it. The substrate 408 can be transparent or opaque (e.g., the opaque substrate is used in top-emitting devices). By modifying or filtering the wavelength of light which can pass through the substrate 408, the color of light emitted by the device can be changed. The substrate 408 can be comprised of glass, quartz, silicon, plastic, or stainless steel; preferably, the substrate 408 is comprised of thin, flexible glass. The preferred thickness of the substrate 408 depends on the material used and on the application of the device. The substrate 408 can be in the form of a sheet or continuous film. The continuous film can be used, for example, for roll-to-roll manufacturing processes which are particularly suited for plastic, metal, and metallized plastic foils. The substrate can also have transistors or other switching elements built in to control the operation of an active-matrix OLED device. A single substrate 408 is typically used to construct a larger display containing many pixels (EL devices) such as EL device 405 repetitively fabricated and arranged in some specific pattern.

First Electrode 411:

In one configuration, the first electrode 411 functions as an anode (the anode is a conductive layer which serves as a hole-injecting layer and which comprises a material with work function typically greater than about 4.5 eV). Typical anode materials include metals (such as platinum, gold, palladium, and the like); metal oxides (such as lead oxide, tin oxide, ITO (Indium Tin Oxide), and the like); graphite; doped inorganic semiconductors (such as silicon, germanium, gallium arsenide, and the like); and doped conducting polymers (such as polyaniline, polypyrrole, polythiophene, and the like).

The first electrode 411 can be transparent, semi-transparent, or opaque to the wavelength of light generated within the device. The thickness of the first electrode 411 can be from about 10 nm to about 1000 nm, preferably, from about 50 nm to about 200 nm, and more preferably, is about 100 nm. The first electrode layer 411 can typically be fabricated using any of the techniques known in the art for deposition of thin films, including, for example, vacuum evaporation, sputtering, electron beam deposition, or chemical vapor deposition.

In an alternative configuration, the first electrode layer 411 functions as a cathode (the cathode is a conductive layer which serves as an electron-injecting layer and which comprises a material with a low work function). The cathode, rather than the anode, is deposited on the substrate 408 in the case of, for example, a top-emitting OLED. Typical cathode materials are listed below in the section for the "second electrode 423".

HIL 417:

The HIL 417 has good hole conducting properties and is used to effectively inject holes from the first electrode 411 to the EML 420 (via the HT interlayer 418, see below). The hole injection layer usually consists of a conductive polymer with a polymeric acid dopant. The hole injection layer 417 may also comprise one or more small molecule materials. Examples of conductive polymers include polypyrrole, polythiophene, polyaniline, etc. For example, the HIL 417 can be fabricated from conducting polyaniline ("PANI"), or PEDOT:PSS (a solution of poly(3,4-ethylenedioxythiophene) ("PEDOT") and polystyrenesulfonic acid ("PSS") available as Baytron P from HC Starck). The HIL 417 can have a thickness from about 5 nm to about 1000 nm, and is conventionally used from about 50 nm to about 250 nm. Preferably, in accordance with at least one embodiment of the invention, the thickness of the HIL is about between 60 nm and 200 nm. The HIL 417 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. A hole injecting and/or buffer material is deposited on the first electrode 411 and then allowed to dry into a film. The dried film represents the HIL 417. In the case of small molecule materials, the small molecules are preferably deposited/evaporated in a vacuum to form the HIL 417.

HT interlayer 418:

The functions of the HT interlayer 418 are among the following: to assist injection of holes into the EML 420, reduce exciton quenching at the anode, provide better hole transport than electron transport, and block electrons from getting into the HIL 417 and degrading it. Some materials may have one or two of the desired properties listed, but the effectiveness of the material as an interlayer is believed to improve with the number of these properties exhibited. The HT interlayer 418 may consist at least partially of or may derive from one or more following compounds, their derivatives, moieties, etc: polyfluorene derivatives, poly(2,7-(9,9-di-n-octylfluorene)-(1, 4-phenylene-((4-secbutylphenyl)imino)-1, 4-phenylene) and derivatives which include cross-linkable forms, non-emitting forms of poly(p- phenylenevinylene), triarylamine type material (e.g. triphenyldiamine (TPD), α-napthylphenyl-biphenyl (NPB)) mixed with a crosslinkable small molecule or polymer matrix, thiopene, oxetane-functionalized polymers and small molecules etc. The hole transporting materials used in the HT interlayer 418 are preferably polymer hole transporting materials, but can be small molecule hole transporting materials with or without a polymer binder. For example, polymers containing aromatic amine groups in the main chain or side chains are widely used as hole transporting materials. In the case of only small molecule materials, the small molecules are preferably deposited/evaporated in a vacuum to form the HT interlayer 418.

Figure 4:
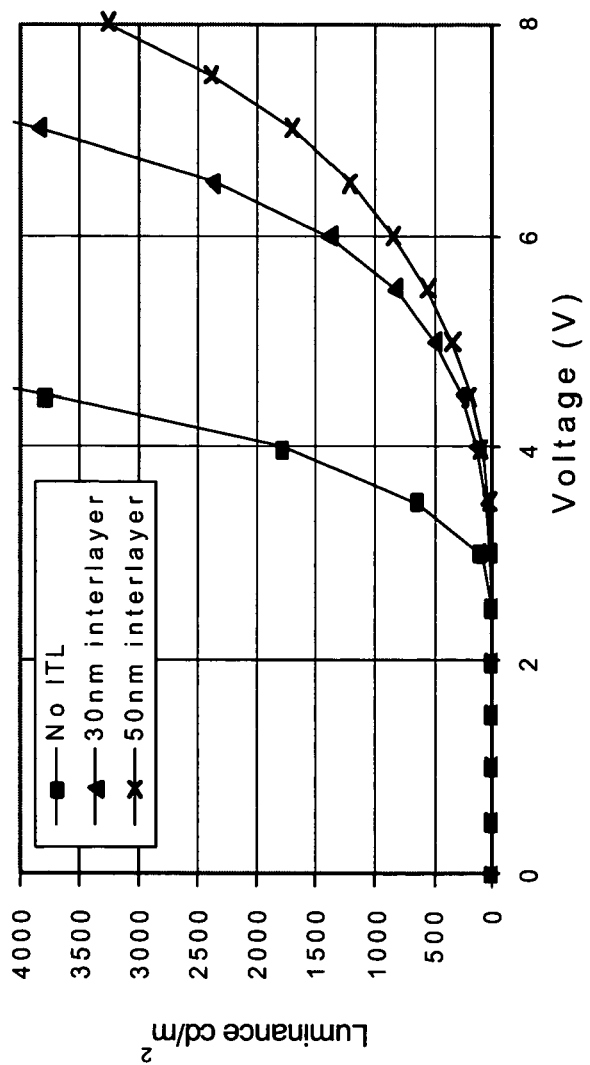
FIG. 4 illustrates the effect of interlayer thickness on changes in luminance versus voltage.

In accordance with the invention, the thickness for such a well-defined hole transporting interlayer is greater than 30 nm and preferably, greater than 50 nm. Control of the interlayer thickness has been shown to have an impact on the dL/dV. Specifically, increasing the thickness of the interlayer will provide a flatter dL/dV and hence a more uniform luminance. This is illustrated in FIG. 4. FIG. 4 shows a first curve of luminance versus voltage for a OLED device without a hole transporting interlayer, the same OLED device with a hole transporting interlayer of 30 nm thickness and the same OLED device with a hole transporting interlayer with a thickness of 50 nm. The device with a 30 nm interlayer has a flatter dL/dV than the device without an interlayer. Likewise, the device with a 50 nm interlayer has a flatter dL/dV than the device with the 30 nm interlayer. From this, it can be concluded that a thicker HT interlayer 418 will yield a flatter dL/dV and thus, a device with greater luminance uniformity.

EML 420:

For organic LEDs (OLEDs), the EML 420 contains at least one organic material that emits light. These organic light emitting materials generally fall into two categories: small-molecule light emitting materials and polymer light-emitting materials. In embodiments of the invention, devices utilizing polymeric active electronic materials in EML 420 are especially preferred. The polymers may be organic or organometallic in nature. As used herein, the term organic also includes organo-metallic materials. Light-emission in these materials may be generated as a result of fluorescence or phosphorescence.

Preferably, these polymers are solvated in an organic solvent, such as toluene or xylene, and spun (spin-coated) onto the device, although other deposition methods are possible too.

The light emitting organic polymers in the EML 420 can be, for example, EL polymers having a conjugated repeating unit, in particular EL polymers in which neighboring repeating units are bonded in a conjugated manner, such as polythiophenes, polyphenylenes, polythiophenevinylenes, or poly-p-phenylenevinylenes or their families, copolymers, derivatives, or mixtures thereof. More specifically, organic polymers can be, for example: polyfluorenes; poly-p-phenylenevinylenes that emit white, red, blue, yellow, or green light and are 2-, or 2,5-substituted poly-p-phenylenevinylenes; polyspiro polymers.

In addition to polymers, smaller organic molecules that emit by fluorescence or by phosphorescence can serve as a light emitting material residing in EML 420. Combinations of PLED materials and smaller organic molecules can also serve as active electronic layer. For example, a PLED may be chemically derivatized with a small organic molecule or simply mixed with a small organic molecule to form EML 420. Examples of electroluminescent small molecule materials include tris(8-hydroxyquinolate) aluminum ($Alq_3$), anthracene, rubrene, tris(2-phenylpyridine) iridium ($Ir(ppy)_3$), triazine, any metal-chelate compounds and derivatives of any of these materials. In the case of only small molecule materials, the small molecules are preferably deposited/evaporated in a vacuum to form the EML 420. Those materials can also be applied by solutions methods or other proper methods.

In addition to materials that emit light, EML 420 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine. EML 420 may also include semiconductors, such as silicon, gallium arsenide, cadmium selenide, or cadmium sulfide.

All of the organic layers such as HIL 417, HT interlayer 418 and EML 420 can be ink-jet printed by depositing an organic solution or by spin-coating, or other deposition techniques. This organic solution may be any "fluid" or deformable mass capable of flowing under pressure and may include solutions, inks, pastes, emulsions, dispersions and so on. The liquid may also contain or be supplemented by further substances which affect the viscosity, contact angle, thickening, affinity, drying, dilution and so on of the deposited drops.

For instance, the HT interlayer 418 can be fabricated by depositing this solution, using either a selective or non-selective deposition technique, onto HIL 417. Further, any or all of the layers 417, 418 and 420 may be cross-linked or otherwise physically or chemically hardened as desired for stability and maintenance of certain surface properties desirable for deposition of subsequent layers.

Second Electrode (423)

In one embodiment, second electrode 423 functions as a cathode when an electric potential is applied across the first electrode 411 and the second electrode 423. In this embodiment, when an electric potential is applied across the first electrode 411, which serves as the anode, and second electrode 423, which serves as the cathode, photons are released from EML 420 and pass through first electrode 411 and substrate 408.

While many materials, which can function as a cathode, are known to those of skill in the art, most preferably a composition that includes aluminum, indium, silver, gold, magnesium, calcium, lithium fluoride, cesium fluoride, sodium fluoride, and barium, or combinations thereof, or alloys thereof, is utilized. Aluminum, aluminum alloys, and combinations of magnesium and silver or their alloys can also be utilized. In some embodiments of the invention, a second electrode 423 is fabricated by thermally evaporating in a two layer or combined fashion barium and aluminum in various amounts.

Preferably, the total thickness of second electrode 423 is from about 3 to about 1000 nanometers (nm), more preferably from about 50 to about 500 nm, and most preferably from about 100 to about 300 nm. While many methods are known to those of ordinary skill in the art by which the second electrode material may be deposited, vacuum deposition methods, such as physical vapor deposition (PVD) are preferred.

Often other steps such as washing and neutralization of films, addition of masks and photo-resists may precede cathode deposition. However, these are not specifically enumerated as they do not relate specifically to the novel aspects of the invention. Other steps (not shown) like adding metal lines to connect the anode lines to power sources may also be included in the workflow. Other layers (not shown) such as a barrier layer and/or getter layer and/or other encapsulation scheme may also be used to protect the electronic device.

Such other processing steps and layers are well-known in the art and are not specifically discussed herein.

Figure 5:
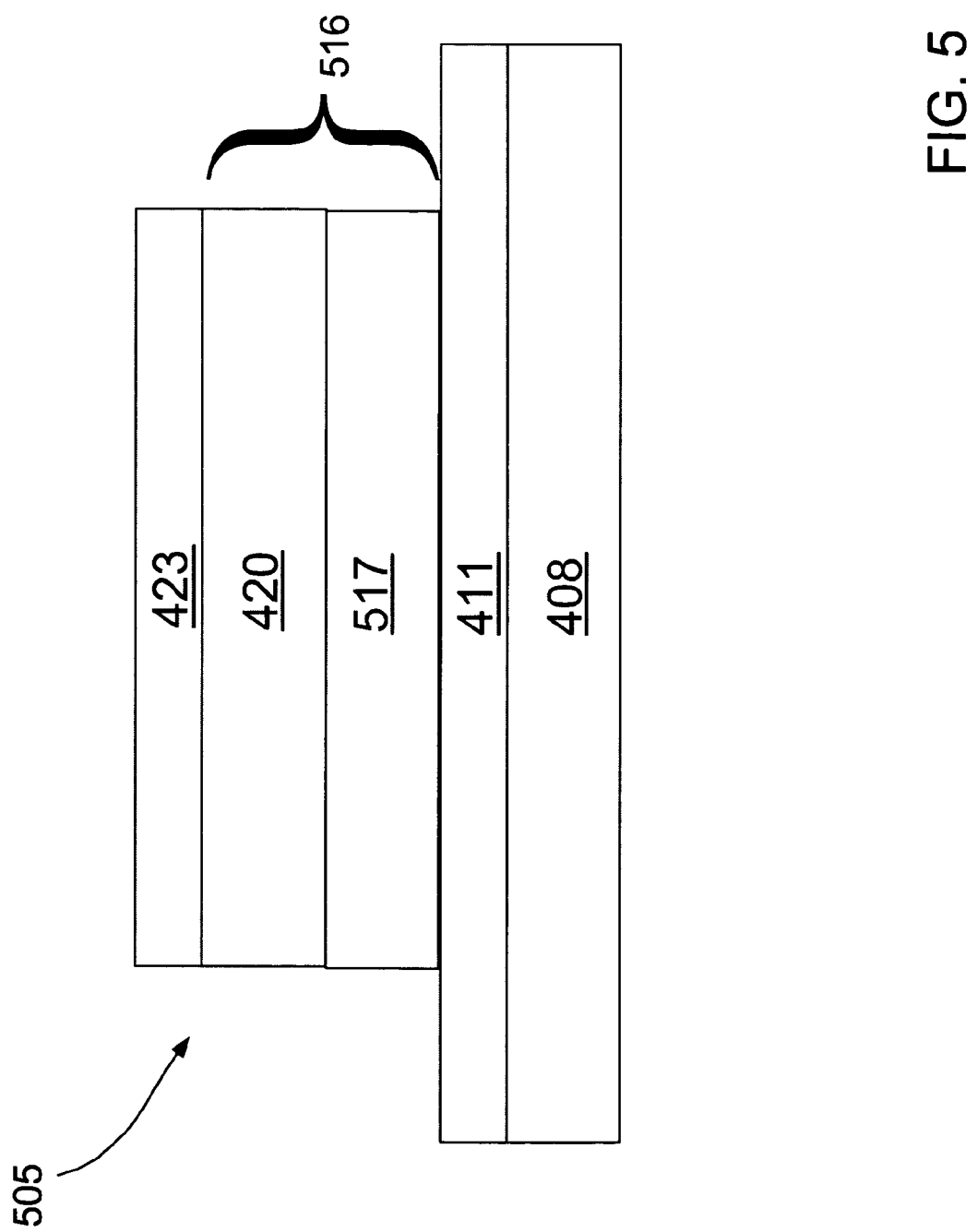
FIG. 5 shows a cross-sectional view of an embodiment of an EL device 505 according to at least one embodiment of the invention.

FIG. 5 shows a cross-sectional view of an embodiment of an EL device 505 according to at least one embodiment of the invention. Device 505 is identical or similar in all aspects to device 405 with respect to like-numbered elements (whose description will not be repeated below) and differs from device 405 in the following:

In contrast with organic stack 416 of device 405 which contains a minimum of three layers, organic stack 516 of device 505 contains a minimum of two layers, EML 420 and a high conductivity hole injection layer (HIL) 517. Other layers than that shown in FIG. 5 may also be added including barrier, charge transport/injection, and interface layers between or among any of the existing layers as desired.

Highly Conductive HIL 517:

The highly conductive HIL (Hole Injection Layer) 517 has very high hole conducting properties and is used to effectively inject holes from the first electrode 411 to the EML 420. A high luminance uniformity is achieved, in accordance with at least one embodiment of the invention, by adopting a highly conductive and highly transmissive hole injection layer on the top of first electrode 411. A typical hole injection layer used for matrix displays generally has very low conductivity and thus high resistivity (usually in the range of 1000 Ohms/cm to 100,000 Ohms/cm) to avoid crosstalk between neighboring pixels. In those devices, the ITO (first electrode) is major conductive path for positive carriers. In a lighting application, crosstalk is not an issue.

In accordance with at least one embodiment of the invention, therefore, a highly conductive hole injection layer (HIL 517) with a conductivity of over 500 S/cm (0.002 Ohms/cm) is utilized in the OLED. In accordance with some embodiments of the invention, a highly conductive hole injection layer (HIL 517) with a conductivity of over 1000 S/cm (0.001 Ohms/cm) is utilized in the OLED . Such a highly conductive HIL 517 can provide an additional current flow path besides the ITO, and minimize voltage drop across the emissive area. Highly conductive HIL 517 layer can be selected from high conductivity version of conductive polymers or their composites. Examples of such conductive polymers include polyacetylene, polypyrrole, polythiophene, and polyaniline. The thickness of the highly conductive HIL 517 is controlled in such a way that total resistance of the first electrode 411 and the highly conductive HIL 517 is reduced substantially, for example, by a factor of 1.5 or higher. For a typical commercially available ITO serving as first electrode 411, the preferred thickness for the high conductivity hole injection layer is greater than 300 nm, and more preferably greater 600 nm. The HIL 417 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. A hole injecting and/or buffer material is deposited on the first electrode 411 and then allowed to dry into a film. The dried film represents the highly conductive HIL 517.

As any person of ordinary skill in the art of electronic device fabrication will recognize from the description, figures, and examples that modifications and changes can be made to the embodiments of the invention without departing from the scope of the invention defined by the following claims.

The invention claimed is:

1. A system comprising:
an organic light emitting diode device having an emitting area of 3 $cm^2$; and
an additional external resistor in series with said organic light emitting diode device, said additional external resistor having a resistance R higher than the dynamic resistance $V_{OLED}/I$ of said organic light emitting diode device, $R>V_{OLED}/I$, wherein the external resistor causes the organic light emitting diode device to have a luminance non-uniformity across the emitting area that is less than 10% and a luminance uniformity across the emitting area of the organic light emitting diode to be improved in comparison to an organic light emitting diode without an external resistor.

2. The system of claim 1 wherein said additional external resistor has a resistance value in the range of 1 to 10 times of the dynamic resistance of said organic light emitting diode device.

3. The system of claim 1 wherein the dL/dV of the organic light emitting diode device is reduced by the additional external resistor compared to a device without an external resistor, wherein dL is a luminance change across the emitting area and dV is a voltage change across the emitting area.

4. The system of claim 3 wherein the anode comprises indium-tin-oxide (ITO) formed as an area and the voltage change is along the area.

5. The system of claim 1 wherein the resistance R of the additional external resistor is during operating conditions higher than the dynamic resistance $V_{OLED}/I$ of the organic light emitting device.

6. The system of claim 1 wherein the organic light emitting diode device has an anode and a cathode and the anode has a higher resistivity than the cathode.

7. The system of claim 6 wherein the anode comprises indium-tin-oxide (ITO).

8. The system of claim 6 wherein the anode has a resistivity of 10 to 20 Ohm/cm.

9. The system of claim 1, wherein the organic light emitting diode device has an emitting area of at least 3 $cm^2$.

10. The system of claim 1, wherein the organic light emitting diode comprises a highly conductive hole injection layer.

11. The system of claim 10, wherein the conductivity of said highly conductive hole injection layer is greater than 500 S/cm.

12. The system of claim 11, wherein the conductivity of said highly conductive hole injection layer is greater than 1000 S/cm.

13. The system of claim 10, wherein the thickness of the highly conductive hole injection layer is such that the total resistance of the anode layer and the highly conductive hole injection layer is a factor of at least 1.5 less than the resistance of the anode layer alone.

14. The system of claim 10, wherein the thickness of the highly conductive hole injection layer is greater than about 300 nm.

15. The system of claim 14, wherein the thickness of the highly conductive hole injection layer is greater than about 600 nm.

* * * * *

UNITED STATES PATENT AND TRADEMARK OFFICE
CERTIFICATE OF CORRECTION

| | | |
|---|---|---|
| PATENT NO. | : 7,626,332 B2 | Page 1 of 1 |
| APPLICATION NO. | : 11/205530 | |
| DATED | : December 1, 2009 | |
| INVENTOR(S) | : Wencheng Su, Homer Antoniadis and Franky So | |

It is certified that error appears in the above-identified patent and that said Letters Patent is hereby corrected as shown below:

On the Title Page, (57) Abstract, at Line 4, replace;

"ductive hole injection layer in a bi-layer device, a thick hoe" with
-- ductive hole injection layer in a bi-layer device, a thick hole --

Signed and Sealed this

Ninth Day of February, 2010

David J. Kappos
*Director of the United States Patent and Trademark Office*